United States Patent
Olsson

(10) Patent No.: US 6,271,479 B1
(45) Date of Patent: Aug. 7, 2001

(54) METHOD AND APPARATUS FOR CONNECTING AN ELECTRIC COMPONENT TO A PRINTED CIRCUIT BOARD

(75) Inventor: Christer Olsson, Lidingö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 08/993,781

(22) Filed: Dec. 18, 1997

(30) Foreign Application Priority Data

Dec. 20, 1996 (SE) .................................................. 9604702

(51) Int. Cl.⁷ ......................................................... H05K 7/20
(52) U.S. Cl. ........................... 174/260; 174/262; 257/676; 257/690; 361/772; 361/773
(58) Field of Search ..................... 174/260, 52.4, 174/252, 262; 257/676, 690; 361/772, 773, 776, 760

(56) References Cited

U.S. PATENT DOCUMENTS

| | | | |
|---|---|---|---|
| 3,872,236 | * 3/1975 | Swengel, Sr. et al. | 174/251 |
| 4,631,820 | * 12/1986 | Harada et al. | 174/260 X |
| 4,777,564 | 10/1988 | Derfiny et al. | 361/773 |
| 4,904,414 | 2/1990 | Peltz et al. | 252/514 |
| 4,991,059 | 2/1991 | Kiyose | 361/773 |
| 4,992,851 | 2/1991 | Platzoeder et al. | 257/676 |
| 5,148,349 | * 9/1992 | Kogure et al. | 361/760 X |
| 5,241,134 | 8/1993 | Yoo | 174/94 R |
| 5,387,888 | 2/1995 | Eda et al. | 333/247 |
| 5,395,876 | 3/1995 | Frentzel et al. | 524/440 |
| 5,616,888 | * 4/1997 | McLaughlin et al. | 174/260 |

FOREIGN PATENT DOCUMENTS

| | | |
|---|---|---|
| 0 258444 | 3/1988 | (EP) . |
| 0 658074 | 6/1995 | (EP) . |
| 0 696159 | 2/1996 | (EP) . |
| 6-252310 | * 9/1994 | (JP) . |
| 94/14193 | 6/1994 | (WO) . |

* cited by examiner

Primary Examiner—Albert W. Paladini
(74) Attorney, Agent, or Firm—Burns, Doane, Swecker & Mathis, L.L.P.

(57) ABSTRACT

A device for electrical and mechanical connection of an electric high-power component which transmits high-frequency electrical signals to conductors on a circuit board. The component includes horizontally projecting connections which to the are glued to the conductors on the circuit board with an electrically conducting adhesive, of which the adhesion to the foundation is greater than a predetermined value. The component is subject to repeated temperature changes which leads to stresses on the connection between the connections and the conductors. The length of the connections is chosen depending on a predetermined threshold value for the highest acceptable attenuation which the high-frequency electrical signal is subject to when passing through the electrical high-power component via the connections. The contact surface of the connections towards the glued joint can be designed so that it includes a number of cavities, whereby the adhesive achieves a better grip to the connections.

11 Claims, 4 Drawing Sheets

METHOD AND APPARATUS FOR CONNECTING AN ELECTRIC COMPONENT TO A PRINTED CIRCUIT BOARD

FIELD OF THE INVENTION

The present invention relates to a method and a device for connecting an electrical component to a circuit board. More closely, it relates to the electrical and mechanical connection of a high-power component which transfers high frequency electrical signals to electrically conducting conductor paths on a circuit board.

STATE OF THE ART

The connecting of electrical components to conductor paths on circuit boards normally takes place through soldering. The components can have projecting connections, so-called legs, or some other type of connection which are soldered to some kind of contact surface which is connected to the conductor paths on the circuit board.

The electrical components can, during use, heat up and be subject to stresses, such as temperature changes or mechanical influences. The component, the component legs and the the circuit board have different coefficients of expansion, whereby the soldered joint is subject to stresses during heating and cooling. Therefore electrical components are normally designed so that they rest on vertically bent legs which permit the components to move. When the component is heated up and expands, the forces produced then can partially be absorbed by the resilient legs.

Patent documents U.S. Pat. Nos. 4,777,564 A, 5,241,134 A and 4,991,059 A describe different embodiments of vertically mounted and bent legs for electrical components.

Not all electrical components can, however, be designed with resilient legs. High-power components, such as high-power transistors, develop such high power losses that the temperature increase becomes considerable during operation. Such components are therefore normally mounted sunken in a hole in the circuit board in contact with a cooling flange in order that sufficient cooling is obtained. An example of such components are high-power transistors which amplify high-frequency electrical signals in base stations in a mobile communication system.

The design of the legs influences the signal quality of the high-frequency signals to a great extent. If the legs are made too long or too bent, the power losses increase in the transistor stage which lowers the amplification of the transistor. The longer and the nearer the bends are, the more narrow-band the transistor stage becomes, at the same time as its tolerance sensitivity increases. If the losses become so great that they encrouch on the amplification, it means that the signal strength is attenuated. In order to avoid this, the legs should be straight, relatively short and arranged projecting horizontally from the transistor.

A disadvantage of today's soldered joints on high-power components is that the soldered joint fatigues and gradually cracks when it is subject to extreme stresses during repeated temperature changes. These temperature changes give rise to cyclic loading of the legs, so-called thermal fatigue.

For practical reasons such component legs are furthermore normally soldered manually, wherefore the quality of the soldered joints can vary.

A soldering material which is normally used during soldering of high-power components is the alloy 62%Sn+36%Pb+2%Ag.

Yet another disadvantage when using soldering materials during the fastening of electrical components is that soldering materials containing lead are environmentally dangerous.

It has become more and more popular, in particular from the environmental point of view, to use electrically conducting adhesives for connecting electronic components to conducting foundations.

Patent documents EP 0 708 582 A1 and EP 0 549 159 A2 describe electrically conducting epoxy adhesives containing conducting particles. The adhesives have improved characteristics in relation to strength and electrical conductivity compared to normal silver-filled epoxy adhesives.

The patent document U.S. Pat. No. 4,904,414 A describes an electrically conducting adhesive which is designed to retain its elastic properties in a large temperature interval (−60° C. to +180° C.).

The patent documents U.S. Pat. Nos. 5,136,365 A, 5,395,876 A, 5,362,421 A and 4,729,809 A describe different electrically conducting adhesives which can be used during the electrical connection of different electrically conducting surfaces.

DESCRIPTION OF THE INVENTION

The present invention tackles the problem of how high-power components which transfer high-frequency electrical signals are to be connected electrically and mechanically to conductor paths on a circuit board.

A further problem is how a connection arrangement between high-power components and conductor paths on the circuit board should be designed in order to hold when subject to large, repeated temperature changes.

An object of the present invention is consequently to connect high-power components, which amplify high-frequency electrical signals, to conductor paths on circuit boards, and to design the connection arrangement between high-power components and conductor paths on the circuit board, so that it does not break when it is subjected to large, repeated temperature changes.

The problems are solved by using electrically conducting adhesives for connecting component legs to conductor surfaces on the circuit board, in combination with selecting the length and shape of the component legs depending on a predetermined threshold value of the signal attenuation for the electrical high-frequency signal.

In more detail, the problem is solved by electrical connections, so-called legs, which project horizontally from the component, being fastened by means of electrically conducting adhesive onto the contact surfaces. The contact surfaces form a part of the conductor paths on the circuit board. The electrically conducting adhesive should have a good pull-off strength to the foundation so that good adhesion to the foundation is obtained. A threshold value for the highest acceptable signal attenuation of the signal strength of the high-frequency signal is determined. The component legs are shaped, according to a preferential embodiment, so that they are as long as possible without the resulting signal attenuation surpassing the threshold level. The component legs can also be made with a number of cavities, whereby the adhesive provides a better grip as it penetrates up into the cavities.

An advantage of the invention is that the length of life for the connection between the legs and the contact surface increases, which results in a lower risk of electrical breakdown.

Yet another advantage of the invention is that the use of electrically conducting adhesive is more environmentally friendly than the use of soldering materials containing lead.

The invention will now be described more closely with the help of preferred embodiments and with reference to the appended drawings.

PREFERRED EMBODIMENTS

Figure 1A:
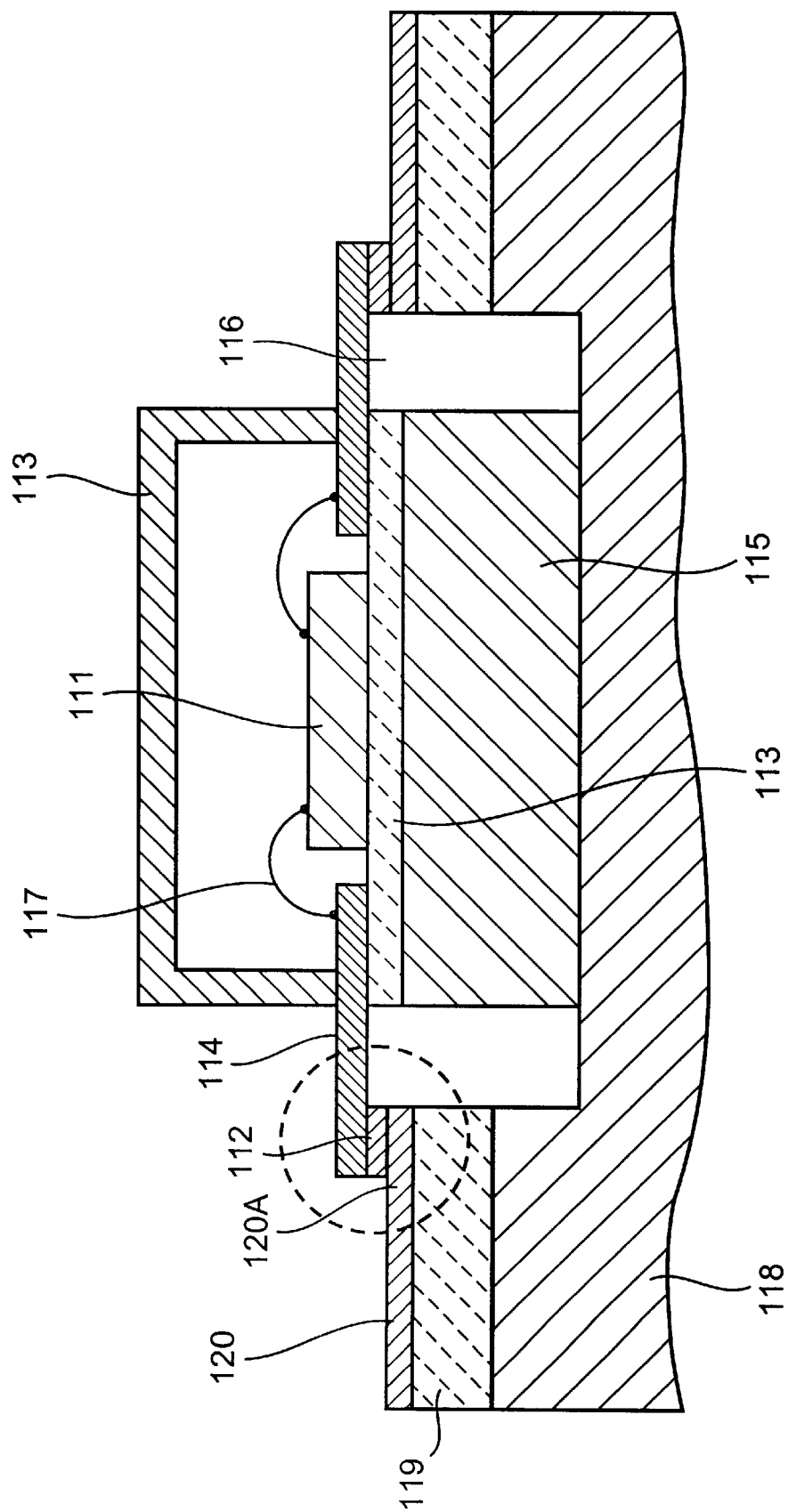
FIG. 1a shows a cross-section of a high-power transistor which is mounted on a circuit board.
Figure 1B:
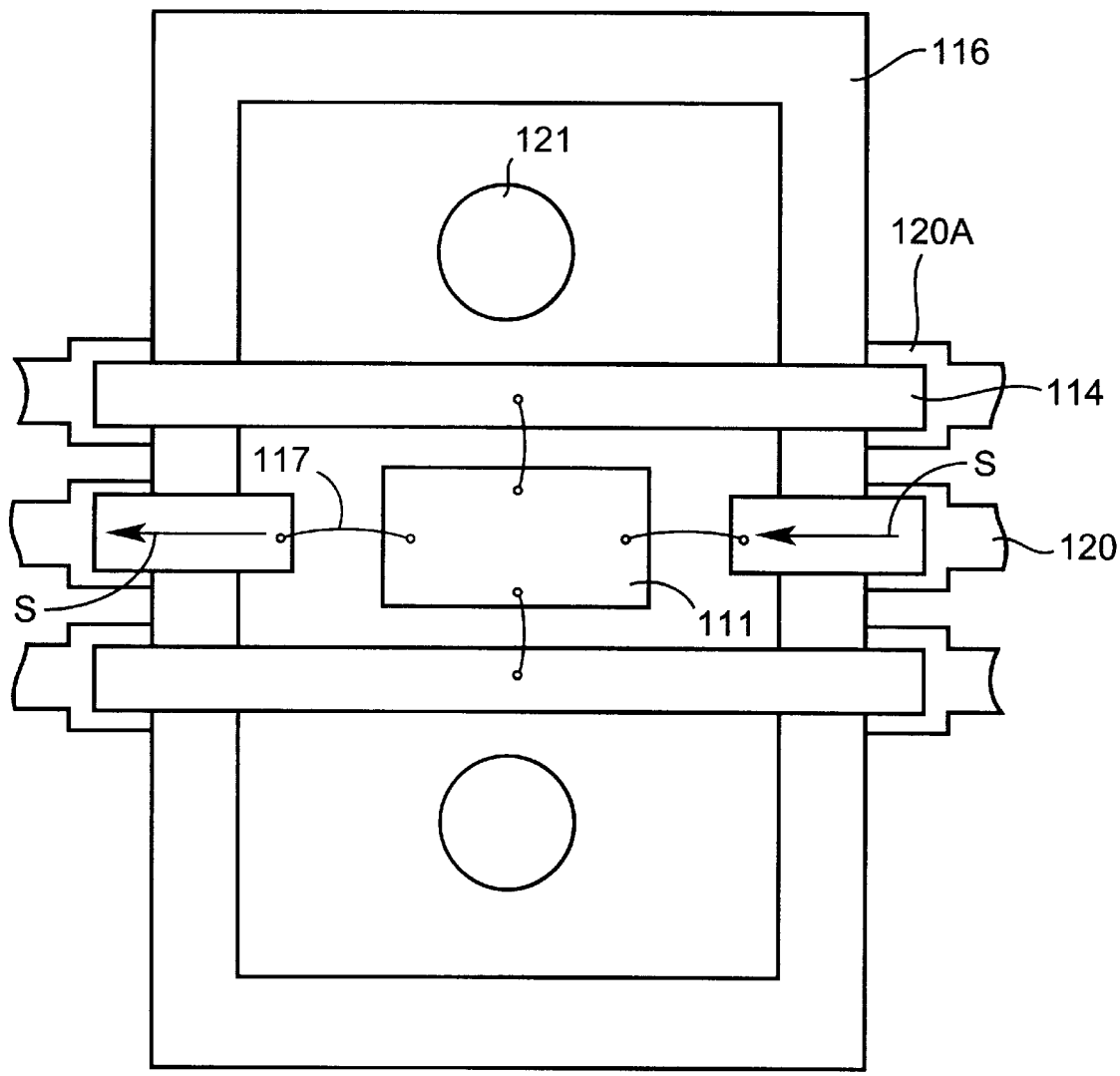
FIG. 1b shows a view of the device seen from straight above.

FIG. 1a shows a cross-section of a high-power transistor 111 which is mounted on a circuit board 119. FIG. 1b shows the device in the unencapsulated state seen from straight above. The figures are not to scale. The high-power transistor 111 is a piece of silicon which is soldered into the bottom of a ceramic capsule 113. The transistor connections 114 project horizontally from the capsule 113. They are electrically connected with the transistor, which in FIG. 1a is illustrated with so-called bonding wires 117 from the respective connections to the transistor. The connections 114 will be called "legs" in the rest of the description.

The bottom surface of the capsule 113 rests on a cooling flange 115 which is sunken in a hole 116 in the circuit board 119. The flange is attached to a framework 118 by means of screws in holes 121. The circuit board is fastened to the framework 118. The legs 114 are intended, by means of some electrically conducting fastening material 112, to be connected electrically and mechanically to the contact surfaces 120a on the circuit board. According to the prior art the fastening material is often a soldering material. On the circuit board 119, electrical contacts in the form of conductor paths 120 are arranged and the contact surfaces 120a are part of the conductors. Between the legs and the contact surfaces the fastening material 112 according to the prior art is a soldered joint.

The region of the construction which the invention most closely treats is marked in FIG. 1a by a dashed circle. This region comprises the component legs 114, the contact surfaces 120a and the fastening material 112 between them.

The high-power transistors can be found, for example, in the radio part of a base station. In such a high-power transistor, power losses of the order of 100 W can be developed which is approximately 100 times greater than the power which is developed by other standard components in the base station. This extremely high power gives rise to high temperature increases in the high-power transistor.

The mounting of high-power transistors as described above in connection with FIGS. 1a and 1b is different, as mentioned earlier, from the mounting of other electrical components in that the legs of the transistor project horizontally parallel with the surface of the circuit board. As mentioned earlier, the signal quality of the electrical signal, during the transmission of high-frequency electrical signals S, is influenced if the transistor legs are too long or are bent.

The different materials in the transistor, the circuit board and the cooling flange have different coefficients of heat expansion. The circuit board material has a higher coefficient of heat expansion than the legs of the transistor. During increases of temperature of the component and its surroundings the different materials therefore expand by different amounts. The conductor paths are also warmed up by the high radio frequencies and the powerful currents which pass via the conductor paths in connection to the high-power transistor. The repeated temperature changes which follow from the transistor alternatively being in operation and out of operation lead to the connections between the transistor legs and the contact surfaces being subject to cyclic torsion and tension forces. The connections between the legs 114 and the contact surface 120a are subject therefore to thermal fatigue.

Efforts have been made to find a better and more durable connection, or connection arrangement, than the solution of today. The term connection arrangement here comprises a combination of contact surface, transistor legs and between these an electrically conducting fastening material which electrically and mechanically joins together the transistor legs and the contact surface. The factors which influence the durability of the connection arrangement are first of all the durability of the fastening material and its adhesiveness towards the foundation, the length of the legs of the component and their shape. Other influencing factors are the surrounding temperature and the leg material. Normal leg material is copper (Cu) and an alloy with the composition 42%Ni+58%Fe, usually called "Alloy 42", and they can have different surface treatments, such as gold or tinning.

According to the invention electrically conducting adhesive is used as a fastening material. Different types of electrically conducting adhesives have been tested with respect to their adhesion capacity and their electrical conducting capacity in order to find out which characteristics are required of the adhesive for the application according to the invention.

Some twenty commercially available electrically conducting adhesives, which all contained grains of silver as the conductive substance, have been tested. Most of the adhesives were epoxy adhesives which are most common during the fastening of electrical components, but acrylic adhesives have also been tested. It has been shown during the tests that the adhesives release from the contact surfaces starting nearest to the transistor where the temperature is highest. An important characteristic of the adhesives is therefore the adhesion to the contact surface.

The adhesion to the contact surface is tested partly by performing torsion tests, partly by performing so-called peel tests. Contact surfaces on circuit boards are normally gold-coated (Au) or lead/tin-coated (Pb/Sn). Tests were therefore performed on both foundations. The electrically conducting adhesive with silver grains have normally a better adhesion to gold-coated surfaces than lead/tin-coated surfaces. This is because most of the lead/tin-foundations form a thin lead oxide layer on its surface. This worsens the adhesion for the electrically conducting adhesive which more easily releases from the foundation.

The torsion tests have not been directly decisive as all the adhesives passed the torsion tests relatively well.

Figure 2:
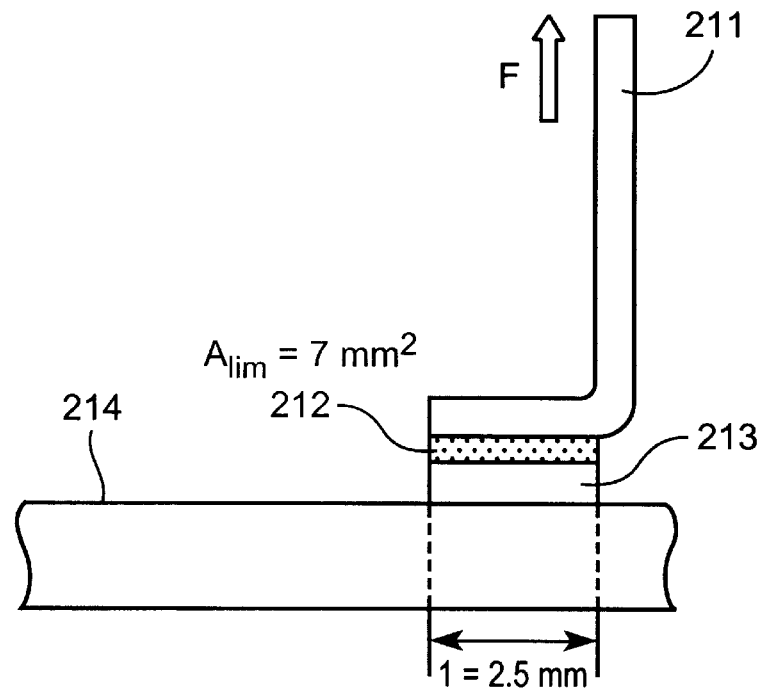
FIG. 2 shows a lateral view of how a pull-off test is performed.

As there also occur tension forces in the connection arrangement which are not parallel with the foundation, these forces were considered to be more decisive for the adhesion of the adhesive. The pull-off tests were performed therefore at an angle of 90°. FIG. 2 shows a sketch of how the test was performed. The sketch is not to scale. A component leg 211 was, by means of electrically conducting adhesive 212, glued onto a contact surface 213 which in turn was fastened onto a circuit board 214. The length of the glue joint was approx. 2.5 mm and its width approx. 3 mm, whereby its total surface area was approx. 7.5 mm². The thickness of the glue joint was 150 µm.

The leg was bent to a 90° angle and pulled straight upwards, as indicated in the figure with a force arrow F. The force required for breaking the leg away from the foundation was measured.

Tests were performed partly directly after the curing of the adhesive (according to the data sheet of the adhesive), partly after simulated ageing at 150° C. for 1000 h, partly after simulated temperature cycling, −40° C./+150° C., 500 times. This temperature interval is considerably greater than what is expected to be the operating interval for the transistor. Such a great temperature interval was selected for accelerating the fatigue of the glue joint. In reality it can take many years before a glue joint releases from the foundation.

The three adhesives which proved to be best with respect to adhesive capacity were selected for further tests. These three adhesives were:

| A: | PC870007 from Heraeus |
| B: | ELECOLITE ® 310 from Elosol |
| C: | LT8845-3 from Parmacol |

According to the table of contents these adhesives comprise:

| A: | 80–90% Ag + 5–10% epoxy hardener + 5–15% epoxy resin |
| B: | Ag + 25–50% epoxy resin |
| C: | 75% Ag + 25% acrylic resin |

Below is shown a table, Table 1, for the results achieved for these three adhesives. The measuring values of the pull-off force F after curing can be found in the column marked $T_1$, after aging under $T_2$ and after temperature cycling under $T_3$.

Directly after curing the force required for the glue joint to come loose from the foundation, when it is gold-plated, are approx. 6 N. Somewhat lower values are generally obtained for lead/tin-coated contact surfaces. Lower values were obtained after aging and after temperature cycling. The lowest value is approx. 2.5 N.

TABLE 1

| | Au-coated contact surface | | | Pb/Sn-coated contact surface | | |
|---|---|---|---|---|---|---|
| Adhesive | F at $T_1$ | F at $T_2$ | F at $T_3$ | F at $T_1$ | F at $T_2$ | F at $T_3$ |
| A | 5.7 N | 3.0 N | ~4 N | 6.8 N | 2.9 N | >5 N |
| B | 5.8 N | 5.1 N | >5 N | 5.3 N | 4.0 N | >5 N |
| C | 6.5 N | 3.8 N | >5 N | 4.7 N | 3.5 N | ~2.5 N |

The adhesion is often stated in the force per unit area (N/mm²), or the force per linear unit (N/mm) which is required for the joint to come loose from the foundation. In the present case the glued joint comes loose beginning at the end where the leg is bent upwards and where the force is applied, wherefore it is appropriate to state the adhesion as the force per linear unit. This is normally called pull-off strength. The pull-off strength for the force 6 N and the length 2.5 mm consequently becomes 2.4 N/mm. The corresponding value expressed in force per unit area for the area 7 mm² therefore becomes 0.86 N/mm². This is considered to be extremely good adhesion. The lowest value of around 2.5 N gives the pull-off strength 1 N/mm, and this is also considered to be good adhesion.

Generally, it can be assumed that pull-off forces greater than 1 N are acceptable pull-off forces in the present case. This corresponds to a pull-off strength of 0.4 N/mm.

The adhesives were also tested with respect to the electrical conduction capacity.

Figure 3A:
FIG. 3a shows a lateral view of a string of adhesive on an insulating carrier which is used during resistance measuring.
Figure 3B:
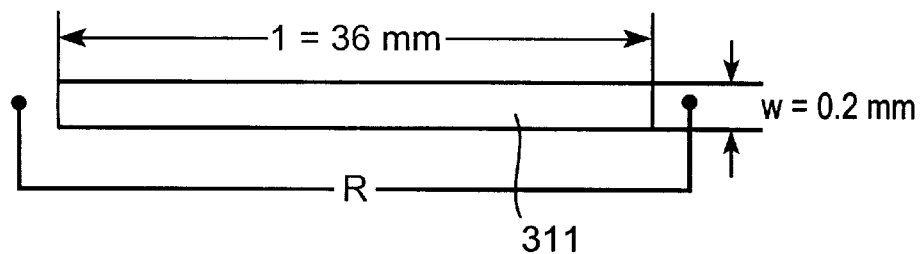
FIG. 3b shows the string of adhesive seen from straight above.

A sketch of a string of glue, over which the resistance was measured seen from the side, is shown in FIG. 3a, and the same string of glue seen from straight above is shown in FIG. 3b. The sketches are not to scale. The resistance R through the glue string 311 applied on an isolating carrier 312 was measured through a four-point measuring. The length of the string of glue was l=35 mm, its width w=0.2 mm and its height h=0.3 mm.

The test results for the three adhesives A–C mentioned above are shown in the table below, Table 2. The same references as in the previous figure states that the measuring took place after curing $T_1$, after aging $T_2$ and after temperature cycling $T_3$.

The highest resistive values, and thereby the lowest electrical conducting capacity, are around R=190 mΩ and this is considered to be a good conducting capacity.

TABLE 2

| Adhesive | R at $T_1$ | R at $T_2$ | R at $T_3$ |
|---|---|---|---|
| A | 49 mΩ | 31 mΩ | 86 mΩ |
| B | 130 mΩ | 112 mΩ | 133 mΩ |
| C | 191 mΩ | 23 mΩ | 118 mΩ |

After these tests it was noted that the adhesive B, i.e. ELECOLITE® 310 had even and high values for the pull-off strength both on gold surfaces and on lead/tin surfaces. This adhesive also has good conductive capacity R=112–133 mΩ, and therefore this adhesive was considered to be the adhesive which best passed the above tests. The other two adhesives were also considered to have very good adhesion and electrical conduction capacity.

In order to be able to be used practically during connection of high-power components for circuit boards on a large scale, the adhesive must furthermore have other characteristics, such as be easy to handle and manufacture.

The length of the legs influences the strength of the connection arrangement. The longer the legs are, the longer the glued joint can be and therefore the greater fastening surface for the adhesive, whereby a greater strength is obtained.

As mentioned earlier, the power losses in the transistor are influenced by the length of the legs. If the legs are selected too long, the signal quality of the electrical high-frequency signal is deteriorated. The signal strength is attenuated and too large attenuation cannot be accepted.

A measure of how much the signal strength is attenuated is obtained if the quotient $P_{in}/P_{out}$ between the signal strength $P_{in}$ in to one leg and the signal strength $P_{out}$ out of the transistor is formed. The attenuation can be expressed in decibels.

According to one embodiment of the invention a threshold level for the attenuation $P_{in}/P_{out}$ is decided which gives the highest tolerated change of the signal strength. According to one embodiment of the invention an attenuation of 0.5 dB is tolerated. If the signal is attenuated more, the loss in the transistor stage is considered to be so large that it encroaches on the amplification for the whole transistor stage, which cannot be accepted. Subsequently it is calculated which maximal length the legs can have without the chosen threshold value being exceeded.

The signal attenuation is dependent on the frequency. This means that the calculated maximal length of the legs becomes longer for a lower frequency than for a higher frequency, at a certain threshold value. The longer the legs are, the larger the fastening surface for the adhesive, but for practical reasons the legs cannot be too long.

A check must therefore be performed after the calculation of the maximal length of the legs. If it shows that the legs cannot be designed as long as the calculated maximal length, the legs are chosen to be shorter than the maximal length, but as long as is practically possible.

According to an advantageous embodiment of the invention the length of the legs is chosen to be as long as the calculated maximal leg length.

Figure 4A:
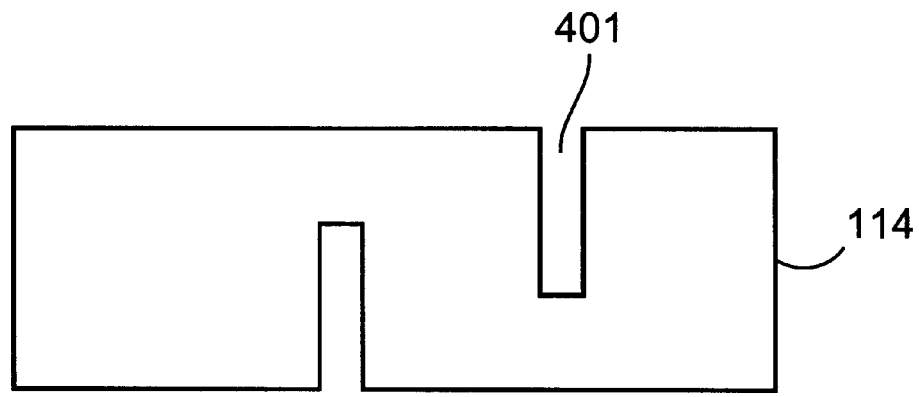
FIG. 4a shows legs comprising rectangular cavities according to a first embodiment of the invention.
Figure 4B:
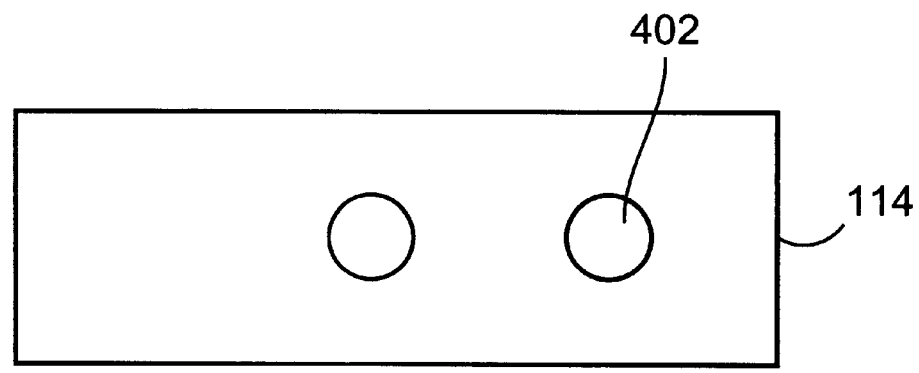
FIG. 4b shows legs comprising circular cavities according to a second embodiment of the invention.
Figure 4C:
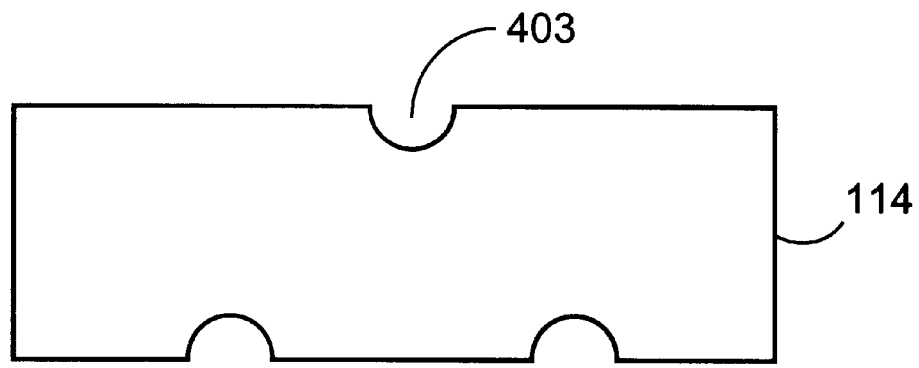
FIG. 4c shows legs comprising semicircular cavities according to a third embodiment of the invention.

The shape of the contact surface of the legs with respect to the glued joint was also considered to be able to influence the strength of the connection joint. The shape of the legs' influence on the durability of the glued joint was therefore tested. The adhesive was shown to have a better grip if the component legs were formed with a number of cavities. This permits the adhesive to flow up into the cavities and get a better grip on the legs, whereby the pull-off strength is increased. FIGS. 4a–c show different embodiments of the contact surfaces of the legs. In FIG. 4a the contact surfaces of the legs 114 comprise rectangular cavities 401. In FIG. 4b the contact surfaces of the legs 114 comprise circular cavities 402, and in FIG. 4c the contact surfaces of the legs 114 comprise semicircular cavities 403. There are naturally many different conceivable embodiments of the contact surface comprising cavities.

The influence of the leg material was also tested and it was shown that legs of copper gave a somewhat better durability with the connection arrangement than legs of Alloy 42.

Tests were performed where the connection arrangement according to the invention was compared with a conventional connection arrangement. The component legs were in this case made as long as possible without going over a predetermined threshold value for the signal attenuation, i.e. the length was equal to the maximal length. The legs were provided with cavities and glued fast with ELECOLITE® 310 to contact surfaces on the circuit board. The leg material was copper. Temperature cycling was simulated according to the above and the time until the glued joint had deteriorated so much that its strength was considered to be unacceptable, was measured. The criteria of the glued joint having deteriorated so much that its strength could not be considered acceptable were: the presence of cracks, or a resistance increase of 10%.

The result was compared with the result for the conventional connection arrangement in which the component legs were shorter and homogeneous and soldered to the foundation by means of a soldering material containing 62%Sn+36%Pb+2%Ag. The component legs in the present case were manufactured of Alloy 42 as this material is most common in such component legs.

The result of the comparison was that the connection device made according to the invention had approximately a 6 times greater life length than a conventional connection arrangement.

According to the invention electrically conducting adhesive is thus used as fastening material. The adhesive should have good adhesive capacity to the foundation. Good adhesion means that in a practical application of the invention, the pull-off strength when glued legs are pulled at an angle of 90° should be greater than 0.4 N/mm. A threshold value is determined which states how much the signal strength of the high-frequency signal is allowed to be reduced. A maximal length which the legs can have without the threshold value being exceeded, is calculated. Thereafter the length of the legs is preferably chosen so that the legs will be as long as the maximal length. If the legs for practical reasons, e.g. space requirements, cannot be made as long as the maximal length, their length is chosen to be less than the maximal length, but as long as is practically possible.

In order to further improve the durability of the connection arrangement according to the invention, the contact surface of the legs can be shaped with cavities, and copper legs can be chosen.

The contact surface of the legs is glued to the contact surface of the circuit board, whereby a connection arrangement with up to 6 times greater length of life as a connection arrangement comprising a conventional soldered joint according to the prior art, can be obtained.

As is evident from the description, the connection of the high-power component is influenced by a large number of factors. These factors have extremely different characters and influence, for example, the strength and signal quality. The inventive concept lies in realizing how the important factors should be chosen and tested and how the selected factors should be combined.

What is claimed is:

1. An arrangement comprising:
   electrically conducting connections projecting horizontally from a high-power component, the connections being free of any bends, the connections having a length that does not cause a threshold signal attenuation value of 0.5 dB to be exceeded;
   an electrically conducting fastening material connecting respective connections with conductors the fastening material comprising an electrically conducting adhesive with a pull-off strength greater than or equal to a threshold value of 0.4N/mm;
   wherein the high-power component is subject to repeated temperature changes and transfers electrical high-frequency signals (S) to the conductors via the connections.

2. The arrangement according to claim 1, wherein the connections are so long as the maximal length permits.

3. The arrangement according to claim 1, wherein the connections comprise a number of cavities.

4. The arrangement according to claim 1, wherein the electrically conducting adhesive is a silver-filled epoxy adhesive.

5. The arrangement according to claim 1, wherein the electrically conducting adhesive is a silver-filled acrylate adhesive.

6. The arrangement according to claim 1, wherein the connections comprise copper (Cu).

7. The arrangement according to claim 1, wherein the connections are manufactured of an alloy with the composition 42%Ni+58%Fe.

8. The arrangement according to claim 1, wherein the high-power component is a high-power transistor.

9. An arrangement comprising:
   electrically conducting connections projecting horizontally from a high-power component, the connections being free of any bends, and the connections comprising a plurality of cavities, the connections having a length that does not cause a threshold signal attenuation value of 0.5 dB to be exceeded; and an electrically conducting fastening material which connects respective connections to conductors the fastening material comprising an electrically conducting adhesive with a pull-off strength greater than or equal to a threshold value of 0.4N/mm;

wherein the high-power component is subject to repeated temperature changes and transfers electrical high-frequency signals (S) to the conductors via the connections.

10. The arrangement according to claim 9, wherein the connections have a length that does not exceed the maximal length which can be used without exceeding a predetermined highest signal attenuation value.

11. The arrangement according to claim 10, wherein the connections are as long as the maximal length permits.

* * * * *